United States Patent
Hatano et al.

(10) Patent No.: US 9,450,173 B2
(45) Date of Patent: Sep. 20, 2016

(54) PIEZOELECTRIC CERAMIC AND PIEZOELECTRIC ELEMENT

(71) Applicant: TAIYO YUDEN CO., LTD., Taito-ku, Tokyo (JP)

(72) Inventors: Keiichi Hatano, Takasaki (JP); Sumiaki Kishimoto, Takasaki (JP); Yutaka Doshida, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 400 days.

(21) Appl. No.: 13/919,602

(22) Filed: Jun. 17, 2013

(65) Prior Publication Data

US 2014/0055009 A1    Feb. 27, 2014

(30) Foreign Application Priority Data

Aug. 24, 2012  (JP) ................................. 2012-185100

(51) Int. Cl.
| | |
|---|---|
| *H01L 41/187* | (2006.01) |
| *H01L 41/047* | (2006.01) |
| *H01L 41/083* | (2006.01) |
| *H01L 41/273* | (2013.01) |

(52) U.S. Cl.
CPC ....... *H01L 41/1873* (2013.01); *H01L 41/0471* (2013.01); *H01L 41/083* (2013.01); *H01L 41/273* (2013.01)

(58) Field of Classification Search
CPC ............................. H01L 41/187; H01L 41/18
USPC ...................... 310/358; 252/62.9 R
See application file for complete search history.

(56) References Cited

U.S. PATENT DOCUMENTS

| | | | | |
|---|---|---|---|---|
| 5,637,949 | A * | 6/1997 | Isogai ................. | G01N 33/004 310/330 |
| 2003/0178605 | A1 | 9/2003 | Nonoyama et al. | |
| 2005/0006618 | A1* | 1/2005 | Nanao .................. | C04B 35/495 252/62.9 R |
| 2006/0290240 | A1* | 12/2006 | Kitagawa et al. | ............ 310/358 |
| 2007/0152183 | A1* | 7/2007 | Furukawa ............. | C04B 35/495 252/62.9 R |
| 2007/0228896 | A1* | 10/2007 | Matsushita ......... | H01L 41/1875 310/368 |
| 2008/0074004 | A1* | 3/2008 | Yamamoto ............ | C04B 35/493 310/358 |
| 2010/0021728 | A1 | 1/2010 | Kaigawa et al. | |

(Continued)

FOREIGN PATENT DOCUMENTS

| | | |
|---|---|---|
| CN | 1898182 A | 1/2007 |
| JP | 2002-068825 A | 3/2002 |

(Continued)

OTHER PUBLICATIONS

A Notification of First Office Action with Search Report issued by the State Intellectual Property Office of China, mailed Sep. 1, 2014, for Chinese counterpart application No. 201310161720.1.

(Continued)

*Primary Examiner* — Shawki S Ismail
*Assistant Examiner* — Bryan Gordon
(74) *Attorney, Agent, or Firm* — Law Office of Katsuhiro Arai

(57) ABSTRACT

A piezoelectric ceramic is constituted by a polycrystal whose main phase is an alkali-containing niobate perovskite structure, where both elemental nickel and elemental manganese are present at the grain boundary of the polycrystal. The piezoelectric ceramic is such that drop in piezoelectric characteristics due to application of high electric field is suppressed.

8 Claims, 9 Drawing Sheets

(56) References Cited

U.S. PATENT DOCUMENTS

| | | |
|---|---|---|
| 2010/0102679 A1 | 4/2010 | Kawada |
| 2011/0156540 A1 | 6/2011 | Hatano et al. |

FOREIGN PATENT DOCUMENTS

| | | |
|---|---|---|
| JP | 2002-208743 A | 7/2002 |
| JP | 2003-342069 A | 12/2003 |
| JP | 2004-300012 A | 10/2004 |
| JP | 2005179143 A | 7/2005 |
| JP | 2008-207999 A | 9/2008 |
| JP | 2010030809 A | 2/2010 |
| JP | 2010-052999 A | 3/2010 |
| JP | 2010-180121 A | 8/2010 |
| WO | 2008/152851 A1 | 12/2008 |

OTHER PUBLICATIONS

A Notice of Reasons for Refusal issued by Japanese Patent Office, mailed Jul. 29, 2014, for Japanese counterpart application No. 2012-185100.

Yasuyoshi Saito et al., Lead-free piezoceramics, Letters to Nature, pp. 84-87, vol. 432, Nov. 4, 2004.

Yiping Guo et al, Phase transitional behavior and piezoelectric properties of ($Na_{0.5}K_{0.5}$)$NbO_3$—$LiNbO_3$ ceramics, Applied Physics Letters, pp. 4121-4123, vol. 85, No. 18, Nov. 1, 2004.

* cited by examiner

PIEZOELECTRIC CERAMIC AND PIEZOELECTRIC ELEMENT

BACKGROUND

1. Field of the Invention

The present invention relates to Pb-free piezoelectric ceramics of alkali-containing niobate perovskite structure, as well as a piezoelectric element containing such piezoelectric ceramics.

2. Description of the Related Art

Piezoelectric ceramics are used as piezoelectric elements. Piezoelectric elements are used as sensor elements and generation elements, among others, by applying the piezoelectric effect of converting mechanical energy to electrical energy. Piezoelectric elements are also used as vibrators, sound generators, actuators, ultrasonic motors, etc., that apply the reverse-piezoelectric effect of converting electrical energy to mechanical energy. In addition, piezoelectric elements are used as circuit elements, vibration control elements, etc., by combining the piezoelectric effect and reverse-piezoelectric effect.

In general, a piezoelectric element has a structure comprising layered piezoelectric ceramic sheets and internal electrodes placed between the layers. A piezoelectric element has two terminals and its internal electrodes are connected alternately to the different terminals. This way, voltage is applied to each piezoelectric ceramic layer when voltage is applied between the terminals.

For high-performance piezoelectric ceramics, PZT material expressed by the composition formula $Pb(Zr,Ti)O_3$—$PbTiO_3$, and PLZT material expressed by the composition formula $(Pb,La)(Zr,Ti)O_3$—$PbTiO_3$, are widely known. However, both of these piezoelectric ceramics, while offering high piezoelectric characteristics, contain Pb which imposes significant burdens on the environment.

Among Pb-free piezoelectric ceramics that do not contain Pb, piezoelectric ceramics having a perovskite structure of alkali-containing niobate (refer to Patent Literatures 1 to 7 and Non-patent Literatures 1 and 2) or of barium titanate (refer to Patent Literature 8) are known as offering relatively good performance.

In particular, Patent Literature 7 discloses piezoelectric ceramics offering improved piezoelectric characteristics, achieved by dispersing a sub phase containing the composition $K_3Nb_3O_6Si_2O_7$ in the main phase of alkali-containing niobate perovskite structure and thereby producing a dense structure constituted by grains of uniform size.

BACKGROUND ART LITERATURE

Patent Literature

[Patent Literature 1] Japanese Patent Laid-open No. 2002-068825
[Patent Literature 2] Japanese Patent Laid-open No. 2003-342069
[Patent Literature 3] Japanese Patent Laid-open No. 2004-300012
[Patent Literature 4] Japanese Patent Laid-open No. 2008-207999
[Patent Literature 5] International Patent Laid-open No. 2008/152851
[Patent Literature 6] Japanese Patent Laid-open No. 2010-180121
[Patent Literature 7] Japanese Patent Laid-open No. 2010-052999
[Patent Literature 8] Japanese Patent Laid-open No. 2002-208743

Non-Patent Literatures

[Non-patent Literature 1] Nature, 432 (4), 2004, pp. 84-87
[Non-patent Literature 2] Applied Physics Letters 85 (18), 2004, pp. 4121-4123

SUMMARY

Piezoelectric ceramics are required to have high insulation performance. In other words, piezoelectric ceramic layers in piezoelectric elements are required to have high insulation performance. The piezoelectric ceramics disclosed in Cited Literature 7 has a fine structure and consequently many grain boundaries in the direction in which voltage is applied. Since piezoelectric ceramics generally have higher insulation property at the grain boundaries than inside the crystal grains, the aforementioned piezoelectric ceramics provide good insulation characteristics desired of piezoelectric ceramic layers constituting piezoelectric elements.

As technologies that utilize piezoelectric elements have improved in recent years, piezoelectric elements are now required to offer resistance to higher electric fields. Accordingly, it is desired that the insulation performance of piezoelectric ceramics used in piezoelectric elements does not drop even when such higher electric fields are applied.

In light of the aforementioned situation, an object of the present invention is to provide piezoelectric ceramics in which drop in insulation performance due to application of high electric field is suppressed, as well as piezoelectric element containing such piezoelectric ceramics.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the piezoelectric ceramic pertaining to an embodiment of the present invention is constituted by a polycrystal whose main phase is an alkali-containing niobate perovskite structure, where both elemental nickel and elemental manganese are present at the grain boundary of the polycrystal.

The piezoelectric element pertaining to an embodiment of the present invention has first internal electrodes, second internal electrodes, and piezoelectric ceramic layers. The ceramic layers are each constituted by a polycrystal whose main phase is an alkali-containing niobate perovskite structure, positioned between each first internal electrode and second internal electrode, where both elemental nickel and elemental manganese are present at the grain boundary of the polycrystal.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

Figure 1:
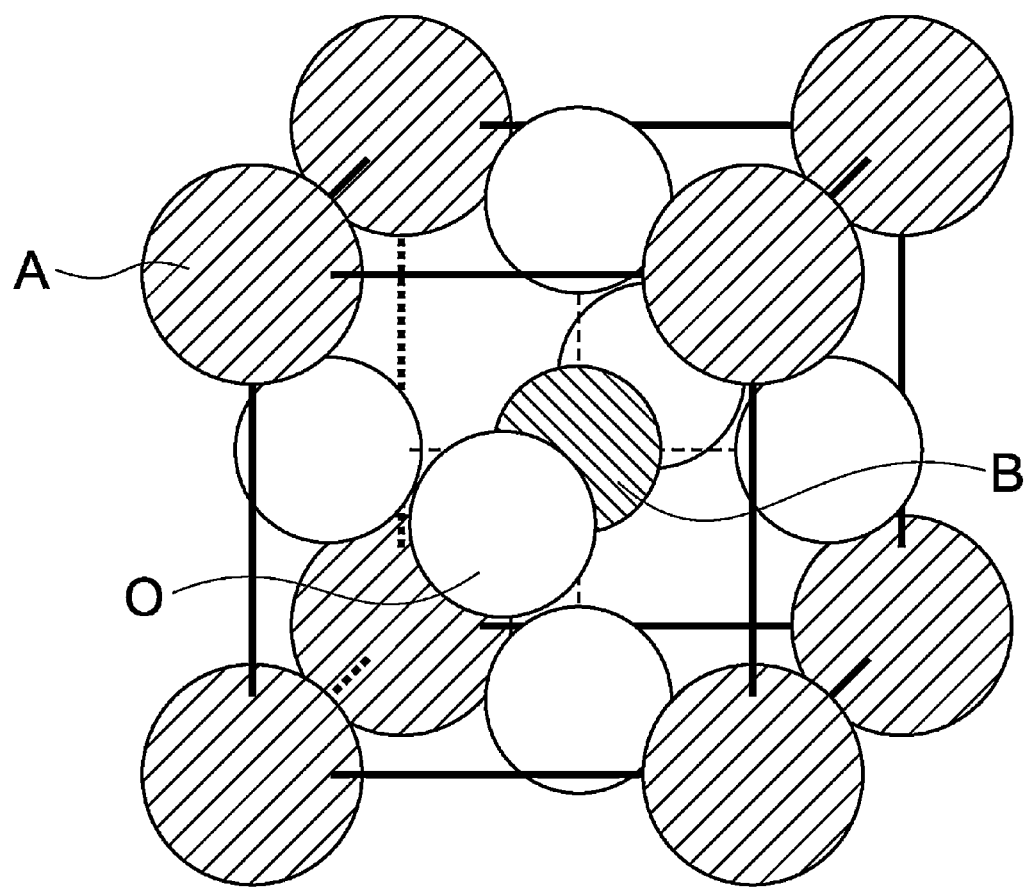
FIG. 1 is a schematic diagram of the unit lattice of a perovskite structure.

10 . . . Piezoelectric element
11 . . . Piezoelectric ceramic
12, 13 . . . Internal electrode
14, 15 . . . External electrode
111 . . . Main phase
112 . . . First sub phase
113 . . . Second sub phase
115 . . . Void

DETAILED DESCRIPTION OF EMBODIMENTS

The piezoelectric ceramic pertaining to an embodiment of the present invention is constituted by a polycrystal whose main phase is an alkali-containing niobate perovskite structure, where both elemental nickel and elemental manganese are present at the grain boundary of the polycrystal. Both elemental nickel and elemental manganese may be present at the crystal triple point of the polycrystal. The piezoelectric ceramic of this constitution is such that drop in piezoelectric characteristics due to application of high electric field is suppressed.

The aforementioned main phase may be one expressed by the composition formula $(Li_xNa_yK_{1-x-y})_a(Nb_{1-z}Ta_z)O_3$ (in the formula, $0.04<x\leq0.1$, $0\leq y\leq 1$, $0\leq z\leq 0.4$, $0.98\leq a\leq 1.01$, and $x+y<1$).

The piezoelectric ceramic of this formula can maintain high piezoelectric characteristics even after application of high electric field.

The aforementioned piezoelectric ceramic may contain 0.1 mol or more but 2.0 mol or less of elemental manganese, and 0.1 mol or more but 2.0 mol or less of elemental nickel, relative to 100 mol of the main phase. The piezoelectric ceramic of this constitution is such that drop in piezoelectric characteristics due to application of high electric field is suppressed further.

A crystal that contains at least one of elemental nickel and elemental manganese may be present at the aforementioned grain boundary. In addition, the average grain size of the crystal that contains at least one of elemental nickel and elemental manganese may be in a range of 0.1 µm or more to 5 µm or less. The piezoelectric ceramic of this formula is such that drop in insulation performance due to application of high electric field is suppressed without the piezoelectric effect being affected.

The average grain size of the crystal in the aforementioned main phase may be in a range of 0.8 µm or more to 3.0 µm or less. The piezoelectric ceramic of this constitution offers excellent piezoelectric characteristics, insulation performance, and mechanical strength.

The aforementioned piezoelectric ceramic may contain 3.0 mol or less of elemental silicon relative to 100 mol of the main phase. The piezoelectric ceramic of this constitution has a dense and uniform structure and therefore offers excellent insulation performance and mechanical strength.

The piezoelectric element pertaining to an embodiment of the present invention has first internal electrodes, second internal electrodes, and piezoelectric ceramic layers. The ceramic layers are each constituted by a polycrystal whose main phase is an alkali-containing niobate perovskite structure, positioned between each first internal electrode and second internal electrode, where both elemental nickel and elemental manganese are present at the grain boundary of the polycrystal. The piezoelectric element of this constitution is such that drop in the insulation performance of the piezoelectric ceramic layer is suppressed when high electric field is applied between the first internal electrode and second internal electrode.

The aforementioned piezoelectric element may further have a first external electrode and second external electrode. The first internal electrodes and second internal electrodes are alternately arranged via the piezoelectric ceramic layers, where the first internal electrodes may each be connected to the first external electrode, while the second internal electrodes may each be connected to the second external electrode. The piezoelectric element of this constitution has a so-called laminated structure and therefore offers excellent piezoelectric characteristics.

An embodiment of the present invention is explained below by referring to the drawings. The drawings show the X-axis, Y-axis and Z-axis that are mutually orthogonal. The X-axis, Y-axis and Z-axis are the same in all drawings.

[Piezoelectric Ceramic 11]

First, study results of the composition of the piezoelectric ceramic 11 used for the piezoelectric element 10 pertaining to this embodiment (refer to FIGS. 2A and 2B) are explained.

(Main Phase)

For the piezoelectric ceramic 11 pertaining to this embodiment, a piezoelectric ceramic whose main phase is an alkali-containing niobate perovskite structure was used. To be specific, the piezoelectric ceramic 11 is constituted by a polycrystal expressed by Composition Formula (1) below:

$$(Li_xNa_yK_{1-x-y})_a(Nb_{1-z}Ta_z)O_3 \quad (1)$$

FIG. 1 is a model of the unit lattice of a perovskite structure. A perovskite structure is expressed by the composition formula $ABO_3$, comprising the atoms conformationally positioned at sites A, atoms conformationally positioned at sites B, and oxygen (O) atoms. As shown in FIG. 1, in a perovskite structure six oxygen atoms are arranged around the atoms at sites B, 12 oxygen atoms are arranged around the atoms at sites A, and these structures are repeated cyclically to form crystal.

In the piezoelectric ceramic 11 pertaining to this embodiment, Li, Na and K, all of which are elemental alkali metals, are conformationally positioned at sites A in FIG. 1, while Nb and Ta are conformationally positioned at sites B. A perovskite structure is theoretically stable, or in a state where the respective atoms are conformationally positioned at all sites A and sites B, when the stoichiometric ratio of A:B=1:1 is satisfied. To be specific, this is a state where a in Composition Formula (1) is equal to 1.

In reality, however, the elements conformationally positioned at sites A, or specifically Li, Na and K, are prone to deficiency due to volatilization during sintering, etc., and specifically they may decrease by around two percent from the level in the stoichiometric composition. Accordingly, it is also possible to obtain a stable perovskite structure close to the stoichiometric composition by predicting the deficiencies in Li, Na and K and increasing Li, Na and K accordingly from the levels in the stoichiometric composition in the initial composition (composition when weighed).

To be specific, it is known that a stable perovskite structure is obtained as long as a in Composition Formula (1) takes a value in a range of $0.98 \leq a \leq 1.01$.

It is also known that good piezoelectric characteristics can be achieved when the ranges of x and y in Composition Formula (1) that determine the ratio of elements conformationally positioned at sites A are $0.04 < x \leq 0.1$ and $0 \leq y \leq 1$, respectively, while the range of z that determines the ratio of elements conformationally positioned at sites B is $0 \leq z \leq 0.4$. Needless to say, the sum of x and y in Composition Formula (1) must satisfy $x+y<1$.

(Sub Phase)

The piezoelectric ceramic pertaining to this embodiment may be constituted in such a way that a sub phase is dispersed in the main phase. Examples of the sub phase include a manganese-containing phase, silicon-containing phase, lithium-containing phase, alkali-earth-metal-containing phase and zirconium-containing phase, among others.

(1) Nickel (Ni)-containing Phase

The insulation performance of the piezoelectric ceramic 11 can be improved by dispersing a nickel-containing phase, as a sub phase, together with the manganese-containing phase described later. If the nickel-containing phase being the sub phase is excessive relative to the main phase, however, the piezoelectric characteristics of the piezoelectric ceramic 11 will drop. It is known that a favorable content of elemental nickel in the piezoelectric ceramic 11 including the nickel-containing phase is 0.1 mol or more but 2.0 mol or less relative to 100 mol of the main phase.

While the details are described later, in this embodiment the nickel-containing phase is intentionally distributed unevenly and is highly concentrated at the grain boundary of the main phase, along with the manganese-containing phase, in the piezoelectric ceramic 11, to improve the insulation performance while maintaining the piezoelectric characteristics of the piezoelectric element. The nickel-containing phase is present primarily as NiO or solid solution of NiO and MnO. However, the nickel-containing phase can also be present as any other oxide containing elemental nickel. Furthermore, the nickel-containing phase may not be a crystalline phase, but it may be present as a non-crystalline phase.

(2) Manganese (Mn)-containing Phase

The insulation performance of the piezoelectric ceramic 11 can be improved by dispersing a manganese-containing phase, as a sub phase, together with the nickel-containing phase described above. If the manganese-containing phase being the sub phase is excessive relative to the main phase, however, the piezoelectric characteristics of the piezoelectric ceramic 11 will drop. It is known that a favorable content of elemental manganese in the piezoelectric ceramic 11 including the manganese-containing phase is 0.1 mol or more but 2.0 mol or less relative to 100 mol of the main phase.

While the details are described later, in this embodiment the manganese-containing phase is intentionally distributed unevenly and is highly concentrated at the grain boundary of the main phase, along with the nickel-containing phase, in the piezoelectric ceramic 11, to improve the insulation performance while maintaining the piezoelectric characteristics of the piezoelectric element. The manganese-containing phase is present primarily as MnO or solid solution of MnO and NiO. However, the manganese-containing phase can also be present as any other oxide containing elemental manganese. Furthermore, the manganese-containing phase may not be a crystalline phase, but it may be present as a non-crystalline phase.

(3) Silicon (Si)-containing Phase

Crystal grain growth in the main phase can be suppressed when the piezoelectric ceramic 11 is sintered, by dispersing a silicon-containing phase as a sub phase. In other words, dispersing a silicon-containing phase as a sub phase provides piezoelectric ceramic 11 whose main phase has a uniform fine crystal structure. The finer the crystal of the piezoelectric ceramic 11, the greater the ratio of the grain boundary per unit volume of the piezoelectric ceramic 11 becomes.

This improves not only the insulation performance, but also the mechanical strength of the piezoelectric ceramic 11. On the other hand, as the silicon-containing phase itself does not react with the main phase, the piezoelectric characteristics of the piezoelectric ceramic 11 will drop if the silicon-containing phase being the sub phase is excessive relative to the main phase. It is known that a favorable content of elemental silicon in the piezoelectric ceramic 11 including the silicon-containing phase is 0.2 mol or more but 3.0 mol or less relative to 100 mol of the main phase.

Desirably the silicon-containing phase is present in a state of $K_3Nb_3O_6Si_2O_7$, $KNbSi_2O_7$ or $K_3LiSiO_4$. Such silicon-containing phase can be produced separately from the main phase, or be separated when the main phase is sintered. For example, piezoelectric ceramic 11 containing $K_3Nb_3O_6Si_2O_7$ as a sub phase can be obtained by preparing a $K_3Nb_3O_6Si_2O_7$ powder separately from the main phase powder and sintering a mixed powder constituted by this powder and main phase powder. It is also possible to separate $K_3Nb_3O_6Si_2O_7$ when a mixed powder constituted by the main phase powder and $SiO_2$ powder is sintered.

(4) Lithium-containing Phase

It is known that use of $Li_2O$ or $Li_2CO_3$ as a sintering auxiliary when the piezoelectric ceramic 11 is sintered improves the sintering property of the piezoelectric ceramics 11. Also, Li contained in $Li_2O$ and $Li_2CO_3$ has the effect of compensating for missing elements at sites A during sintering.

If $Li_2O$ or $Li_2CO_3$ is used as a sintering auxiliary, a lithium-containing phase may remain in the sintered piezoelectric ceramic as a sub phase. The lithium-containing phase may be present in a state of $Li_2O$, for example.

However, it is known that the sintering property of the piezoelectric ceramic 11 improves as long as the content of $Li_2O$ or $Li_2CO_3$ being the sintering auxiliary is 0.1 mol or more but 1.5 mol or less relative to 100 mol of the main phase.

Also, if necessary, a composition containing at least one of Sc, Ti, V, Cr, Fe, Co, Cu and Zr, all of which are first transition elements, can be added to the piezoelectric ceramic 11 pertaining to this embodiment, for example, for the purpose of controlling the sintering temperature and suppressing the growth of crystal grains.

Furthermore, if necessary, a composition containing at least one of Y, Mo, Ru, Rh and Pd, all of which are second transition elements, can be added to the piezoelectric ceramic 11 pertaining to this embodiment, for example, for the purpose of controlling the sintering temperature, suppressing the growth of crystal grains and extending the longevity in a high electric field.

In addition, if necessary, a composition containing at least one of La, Ce, Pr, Nd, Sm, Eu, Gd, Tb, Dy, Ho, Er, Tm, Yb, Lu, Hf, W, Re, Os, Ir, Pt and Au, all of which are third transition elements, can be added to the piezoelectric ceramic 11 pertaining to this embodiment, for example, for the purpose of controlling the sintering temperature, suppressing the growth of crystal grains and extending the longevity in a high electric field.

If necessary, a complex composition comprising transition elements selected from the aforementioned first transition elements, second transition elements, and third transition elements can also be added to the piezoelectric ceramic 11 pertaining to this embodiment.

[Piezoelectric Element]

(Constitution of Piezoelectric Element 10)

Figure 2A:
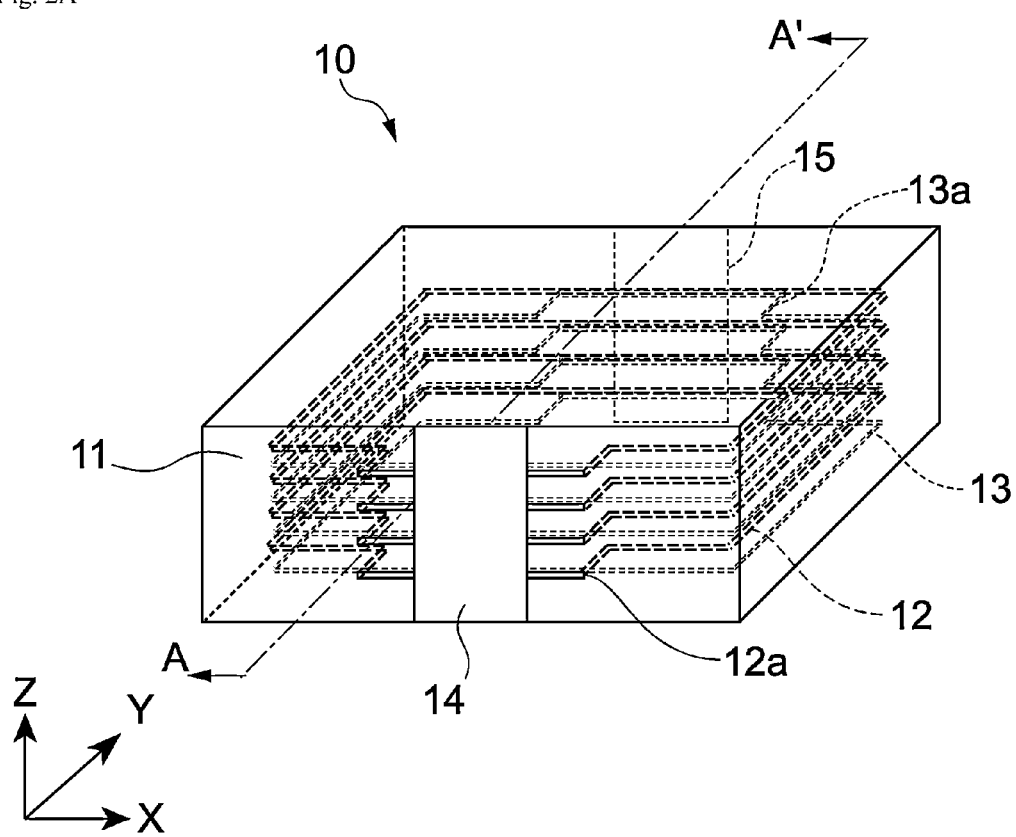
FIG. 2A is a perspective view of a piezoelectric element pertaining to an embodiment of the present invention.
Figure 2B:
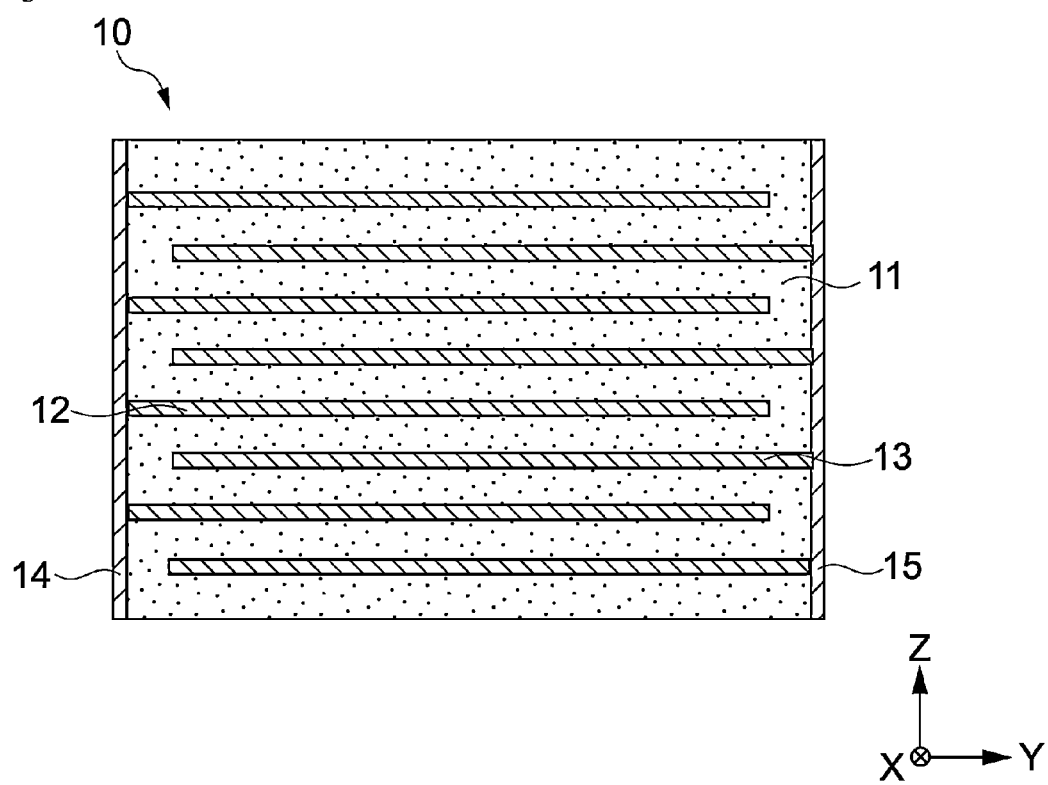
FIG. 2B is a section view of the piezoelectric element shown in FIG. 2A, cut along line A-A'.

FIGS. 2A and 2B show the piezoelectric element 10 pertaining to this embodiment, where FIG. 2A is a perspective view, while FIG. 2B is a section view of FIG. 2A, cut along line A-A'. In FIG. 2A, the internal structure of the piezoelectric element 10 is indicated by broken lines based on perspective representation for illustration purposes.

The piezoelectric element 10 has piezoelectric ceramic 11 as well as external electrodes 14, 15 provided at both ends, in the Y-axis direction, of the piezoelectric ceramic 11. The piezoelectric element 10 also has two types of internal electrodes 12, 13 that extend in the directions along the XY plane inside the piezoelectric ceramic 11 and arranged alternately in a manner opposing each other in the Z-axis direction.

The number of internal electrodes 12, 13 can be determined in any way as required. Formed on each internal electrode 12 is a projection 12a that projects toward the external electrode 14 side in the Y-axis direction and is exposed onto the side face of the piezoelectric ceramic 11. Each projection 12a is connected to the external electrode 14. Formed on each internal electrode 13 is a projection 13a that projects toward the external electrode 15 side in the Y-axis direction and is exposed onto the side face of the piezoelectric ceramic 11. Each projection 13a is connected to the external electrode 15. The thickness in the Z-axis direction of the internal electrodes 12, 13 can be determined as deemed appropriate. The thickness in the Z-axis direction of the internal electrodes 12, 13 may be 0.5 μm or more but 2 μm or less, for example.

While FIGS. 2A and 2B show an example where the total number of internal electrodes 12, 13 is eight for illustration purposes, the number of internal electrodes 12, 13 can be determined in any way as required according to the purpose, etc., of the piezoelectric element 10. In other words, the piezoelectric ceramic 11 can have any number of layers as long as there is at least one layer.

Also, in each layer of the piezoelectric ceramic 11, the top layer and bottom layer in the Z-axis direction, which are not arranged between the internal electrodes 12, 13, do not achieve any piezoelectric effect when the piezoelectric element 10 is used. Accordingly, the top layer and bottom layer of the piezoelectric element 10 in the Z-axis direction need not be constituted by the piezoelectric ceramic 11. However, preferably the top layer and bottom layer of the piezoelectric element 10 in the Z-axis direction are constituted by insulation material in order to prevent electrical continuity between the external electrodes 14, 15.

The internal electrodes 12, 13 of the piezoelectric element 10 are constituted as Pt electrodes which are conductive layers containing Pt as their main constituent. However, the internal electrodes 12, 13 need not be Pt electrodes, but they can also be Pd electrodes or Ag—Pd electrodes, for example. In addition, the external electrodes 14, 15 of the piezoelectric element 10 are constituted as Ag electrodes which are conductors whose main constituent is Ag. However, the external electrodes 14, 15 need not be Ag electrodes, but they can also be constituted by Pb-free solder, for example.

The external electrodes 14, 15 are provided in band shapes that extend in the Z-axis direction on both sides in the Y-axis direction. However, the external electrodes 14, 15 only need to electrically connect the internal electrodes 12, 13, and can be constituted in such a way, for example, that they entirely cover both sides of the piezoelectric element 10 in the Y-axis direction.

Because of this constitution of the piezoelectric element 10, applying voltage between the external electrodes 14, 15 has the effect of applying voltage between the internal electrodes 12, 13 that are adjacent to each other. Each piezoelectric ceramic 11 layer between the internal electrodes 12, 13 exhibits a varying degree of piezoelectric effect according to the voltage applied between the internal electrodes 12, 13, and deforms by expanding or contracting in the Z-axis direction.

Figure 3:
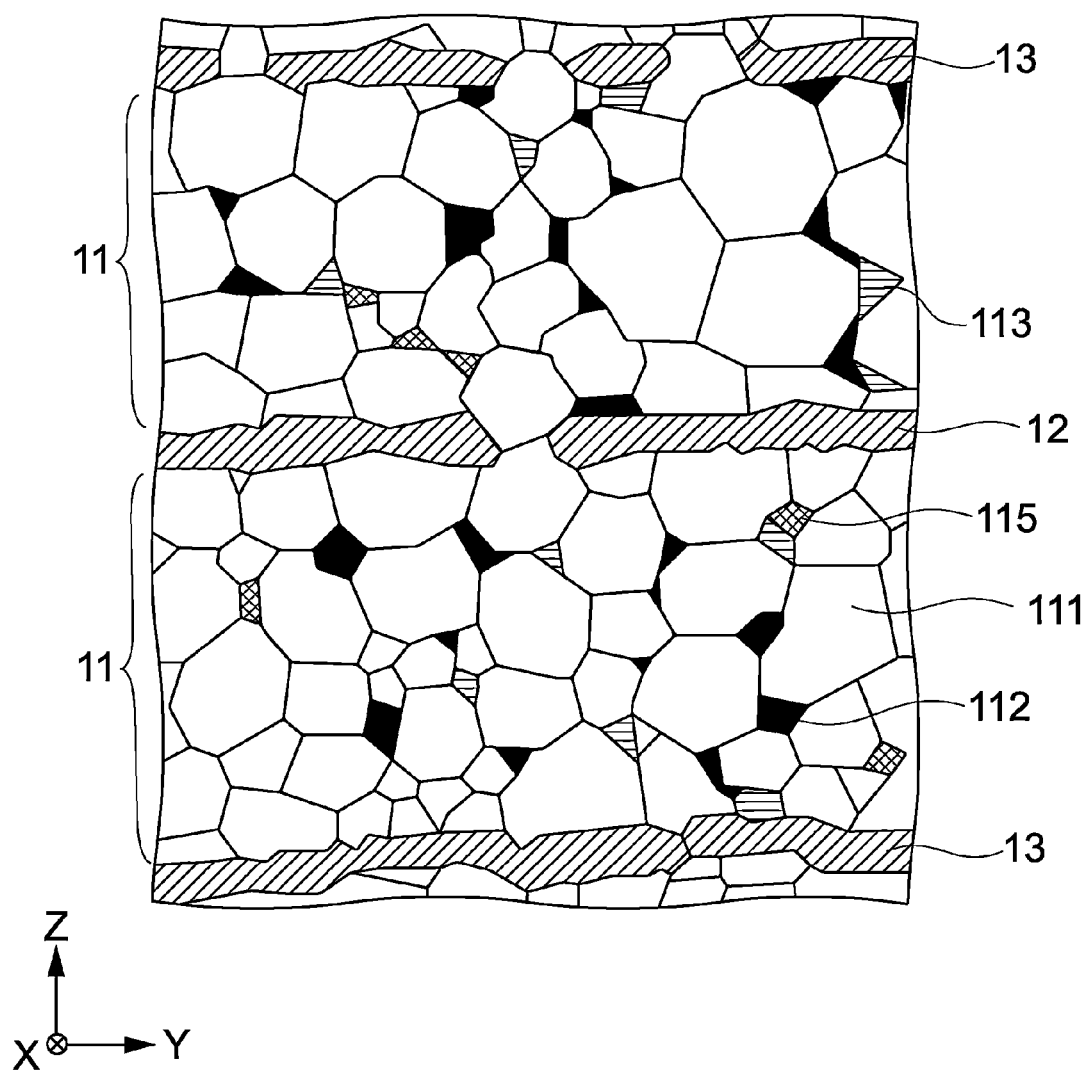
FIG. 3 is an enlarged view of a part of the piezoelectric element shown in FIG. 2B.

FIG. 3 is a schematic drawing showing an enlarged view of a part of the section view of the piezoelectric element 10 shown in FIG. 2B. The piezoelectric ceramic 11 is constituted by a polycrystal whose main phase 111 is an alkali-containing niobate perovskite structure. The piezoelectric ceramic 11 contains, in addition to the main phase 111, a first sub phase 112, second sub phase 113, and voids 115.

As for the main phase 111, desirably the average grain size of its crystal is in a range of 0.8 μm or more to 3.0 μm or less. This is because the piezoelectric characteristics (such as piezoelectric constant $d_{33}$*) of the piezoelectric ceramic 11 drop significantly if the average grain size of the crystal of the main phase 111 is smaller than 0.8 μm, while the insulation performance drops significantly if the average grain size of the crystal of the main phase 111 is greater than 3.0 μm. The crystal grain size of the main phase 111 can be controlled by separating the aforementioned silicon-containing phase or adjusting the sintering temperature.

In this embodiment, the crystal grain size was calculated as the so-called area-equivalent diameter. To be specific, a cross-section of the crystal structure was observed with a SEM (scanning electron microscope), the area of crystal grains was converted to the diameter of a circle giving an equivalent area, and this diameter was taken as the crystal grain size. The average grain size of the crystal can also be obtained as the average of grain sizes of crystal grains found in a 100 μm×100 μm area of the crystal structure, for example. Needless to say, the observation area of the crystal structure and the observed gains can be selected as deemed appropriate or randomly.

The first sub phase 112 is dispersed at the grain boundary (including the grain boundary triple point) of the main phase 111 throughout the piezoelectric ceramic 11. The sub phase 112 contains both elemental manganese and elemental nickel. The sub phase 112 helps improve the insulation performance of the piezoelectric ceramic 11. Desirably the sub phase 112 is dispersed finely, not as large clumps, and uniformly in the piezoelectric ceramic 11. Details of how the piezoelectric ceramic 11 can have such structure are described later.

The sub phase 112 may be a solid solution constituted by fully dissolved NiO and MnO, for example. The concentration of elemental nickel and concentration of elemental manganese may not be uniform in the grain of the sub phase 112. In addition, the sub phase 112 only needs to contain both elemental manganese and elemental nickel and may be constituted by an oxide containing other elements, for example.

Desirably the average grain size of the crystal of the sub phase 112 containing both elemental manganese and elemental nickel is 0.1 μm or more but 5 μm or less. If the average grain size of the crystal of the sub phase 112 is greater than 5 μm, the sub phase 112 does not exhibit any piezoelectric effect, which inhibits the electric field response of the main phase 111 and causes the piezoelectric characteristics of the piezoelectric ceramic 11 to drop significantly. If the average grain size of the crystal of the sub phase 112 is smaller than 0.1 μm, on the other hand, the sub phase 112 does not sufficiently improve the insulation performance of the piezoelectric ceramics 11.

The second sub phase 113 is different from the first sub phase 112 and is constituted by $SiO_2$ crystal or $ZrO_2$ crystal, for example. The sub phase 113 needs to be contained in the piezoelectric ceramic 11 only as necessary, and it may not be contained in the piezoelectric ceramic 11 at all.

The voids 115 are where none of the grains or the like present at the grain boundary of the main phase 111, etc., exists. The voids 115 may be contained in the piezoelectric ceramic 11, but desirably they are kept as to as few as possible. This is because too many voids 115 can cause the piezoelectric characteristics and mechanical strength of the piezoelectric ceramic 11 to drop.

(Manufacturing Method of Piezoelectric Element 10)

Figure 4:
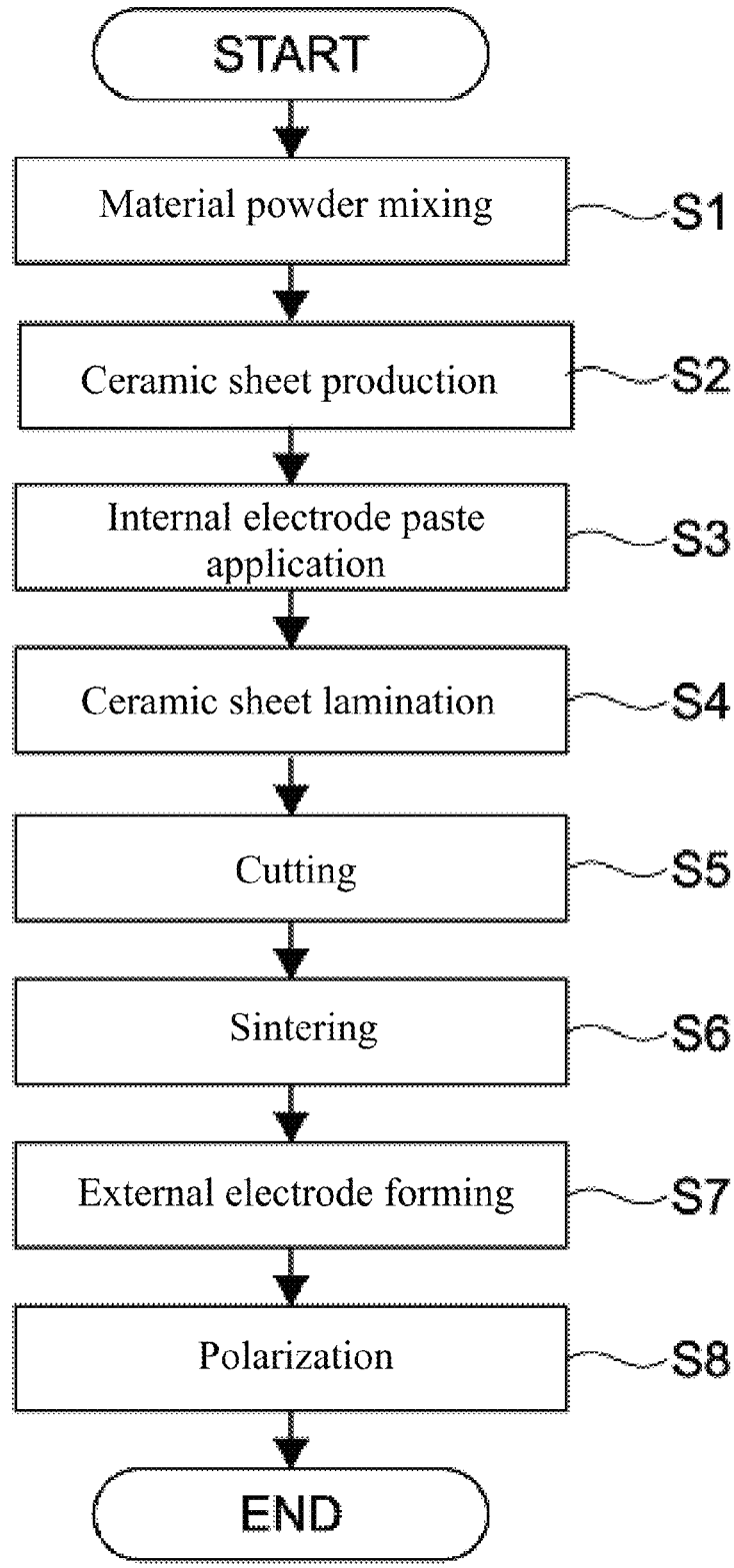
FIG. 4 is a schematic drawing illustrating the manganese dispersion step performed to make the piezoelectric element shown in FIG. 2A.

FIG. 4 is a flow chart indicating the manufacturing method of the piezoelectric element 10 pertaining to this embodiment. Each step is explained below.

(S1) Material Powder Mixing Step

First, material powders are weighed to achieve the target composition. As a material powder containing elemental lithium, lithium carbonate ($Li_2CO_3$) can be used, for example. As a material powder containing elemental sodium, sodium carbonate ($Na_2CO_3$) or sodium hydrogen carbonate ($NaHCO_3$) can be used, for example. As a material powder containing elemental potassium, potassium carbonate ($K_2CO_3$) or potassium hydrogen carbonate ($KHCO_3$) can be used, for example. As a material powder containing elemental niobium, niobium pentoxide ($Nb_2O_5$) can be used, for example. As a material powder containing elemental tantalum, tantalum pentoxide ($Ta_2O_5$) can be used, for example.

Next, the weighed material powders are mixed. The material powders are sealed in a cylindrical pot, together with ethanol and partially stabilized zirconia (PSZ) balls, and mixed using the ball mill method. After 10 hours to 60 hours of agitation using the ball mill method, ethanol is evaporated and the remaining mixture is dried to obtain a mixed powder constituted by fully mixed material powders. Under the ball mill method, other organic solvent may be used instead of ethanol.

Next, the mixed powder is calcined. Calcining is performed by holding the mixed powder in a crucible at a temperature of 700° C. to 950° C. for 1 hour to 10 hours. Then, the calcined compact is crushed using the ball mill method to obtain a calcined powder.

Now, material powders of the elements to constitute the aforementioned sub phases are mixed into the calcined powder.

As for the elements to constitute the first sub phase 112, desirably MnO powder is used as a material powder containing elemental manganese and NiO powder is used as a powder containing elemental nickel. As a material powder containing elemental manganese, manganese carbonate ($MnCO_3$), manganese dioxide ($MnO_2$), trimanganese tetraoxide ($Mn_3O_4$) or manganese acetate ($Mn(OCOCH_3)_2$) can also be used, for example.

As for the elements to constitute the second sub phase 113, silicon dioxide ($SiO_2$) can be used as a material powder containing elemental silicon, for example. As material powders containing calcium, barium, and elemental strontium, calcium carbonate ($CaCO_3$), barium carbonate ($BaCO_3$) and strontium carbonate ($SrCO_{33}$) can be used, respectively, for example. As a material powder containing elemental zirconium, zirconium oxide ($ZrO_2$) can be used, for example.

Each material powder can contain not only one type of element to constitute the second sub phase 113, but it can also contain two or more types of elements to constitute the sub phase. As a material powder containing elemental lithium and elemental silicon, lithium silicate ($Li_2SiO_3$) or lithium orthosilicate ($Li_4SiO_4$) can be used, for example. Additionally, as a material powder containing elemental calcium and elemental silicon, calcium metasilicate ($CaSiO_3$) or calcium orthosilicate ($Ca_2SiO_4$) can be used. Furthermore, as a material powder containing elemental calcium and elemental zirconium, calcium zirconate ($CaZrO_3$) can be used. Also, as a material powder containing elemental strontium and elemental zirconium, strontium zirconate ($SrZrO_3$) can be used.

Specific types and amounts of material powders of the elements to constitute the sub phases 112, 113, as well as organic binder, dispersant and pure water, are added to the calcined powder and wet-mixed using the ball mill method, to produce a ceramic slurry. The conditions of the ball mill method are determined as deemed appropriate so that the calcined powder mixes with the material powders of the elements to constitute the sub phases in a sufficiently uniform manner. For the wet mixing using the ball mill method, ethanol or other organic solvent may be used instead of pure water.

(S2) Ceramic Sheet Production Step

The ceramic slurry is formed into a sheet shape using the doctor blade method, to obtain a ceramic sheet. This ceramic sheet will become one layer of piezoelectric ceramic 11 between each pair of electrodes 12, 13 as shown in FIGS. 2A and 2B. The thickness of the ceramic sheet can be controlled by the height of the blade on the doctor blade device and is determined as deemed appropriate according to the constitution of the piezoelectric element 10. The thickness of the ceramic sheet can be 20 μm, for example.

(S3) Internal Electrode Film Application Step

In the internal electrode film application step, the internal electrodes 12, 13 shown in FIG. 2B are formed on the ceramic sheet obtained in the above step (S2).

Figure 5:
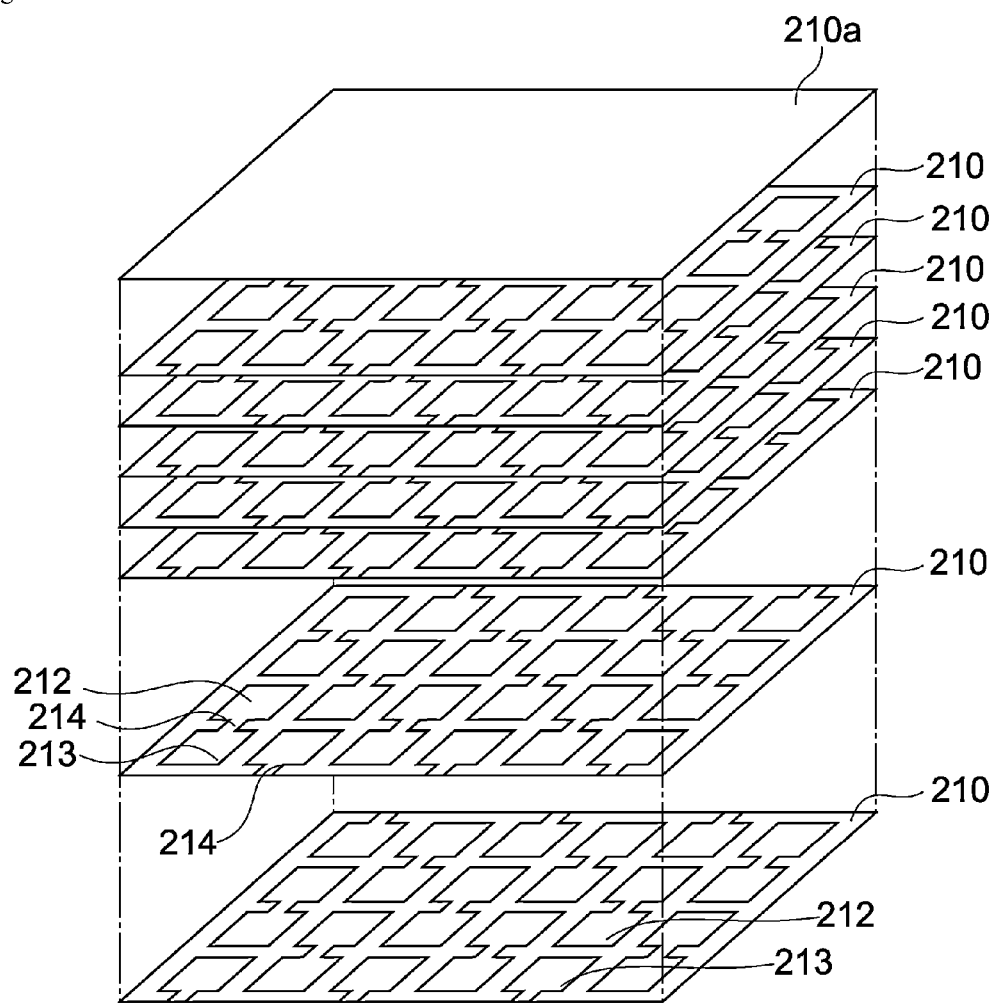
FIG. 5 is a schematic drawing of the piezoelectric element shown in FIG. 2A in the manufacturing process.

FIG. 5 is a schematic drawing showing the manufacturing process of the piezoelectric element 10. In the internal electrode film application step (S3), a conductive paste (electrode paste) is applied in specified patterns on each ceramic sheet 210, to form internal electrode films 212, 213, as shown in FIG. 5. The internal electrode films 212, 213 are formed by screen printing using a screen on which internal electrode patterns are formed, for example.

As is evident from FIG. 5, multiple internal electrode films 212, 213 are formed in the X-axis direction and Y-axis direction on one ceramic sheet 210 having large dimensions in the X-axis direction and Y-axis direction. The internal electrode film 212 and internal electrode film 213 are connected at a narrow part 214 which is formed to have a narrow width in the X-axis direction. It should be noted that, due to the nature of patterns, the internal electrode films 212, 213 are disconnected at the narrow parts 214 of their ends in the Y-axis direction of the ceramic sheet 210, at every other place in the X-axis direction.

In this embodiment, a conductive paste containing Pt was used for the internal electrode films 212, 213 because the internal electrodes 12, 13 shown in FIGS. 2A and 2B are Pt electrodes. However, the conductive paste can be changed as deemed appropriate according to the material of the internal electrodes 12, 13.

Examples of internal electrodes 13, 14 other than Pt electrodes include Pd electrodes and Ag—Pd electrodes. In the cases of these other electrodes, the internal electrode film 112 is formed using a conductive paste containing Pd and conductive paste containing Ag and Pd, respectively.

(S4) Ceramic Sheet Lamination Step

In the ceramic sheet lamination step (S4), a specified number of the ceramic sheets 210 on which the internal electrode films 212, 213 are formed, as obtained in the above step (S3), are layered in the Z-axis direction so that the patterns of the internal electrode films 212, 213 are alternately reversed in the Y-axis direction, as shown in FIG. 5.

Next, the laminate of ceramic sheets 210 is pressurized in the Z-axis direction, which represents the laminating direction, to press together the layers into one piece. The pressure applied to the laminate of ceramic sheets 210 in the Z-axis direction can be determined as deemed appropriate, such as 50 MPa, for example. By thus pressurizing the laminate of ceramic sheets 210 in the Z-axis direction, each ceramic sheet 210 layer deforms slightly and adjacent composite ceramic sheets 210 come in close contact with each other at their outer peripheries. This way, the laminate of composite ceramic sheets 210 becomes a one-piece rectangular solid.

For an uppermost ceramic sheet 210a in the Z-axis direction, a ceramic sheet having no internal electrode films 212, 213 formed on it is used. This way, the top face of the laminate in the Z-axis direction is insulated.

(S5) Cutting Step In the cutting step (S5), the laminate obtained in the above step (S4) is cut to each piezoelectric element 10 (FIGS. 2A and 2B). First, by referring to FIG. 5, the laminate is cut between the rows of internal electrode films 212, 213 arranged in the X-axis direction, along the Y-axis direction. Next, by referring to FIG. 5, each cut piece of the laminate is cut along the X-axis direction in such a way that each narrow part 214 is cut at its center position into equal parts in the Y-axis direction. Needless to say, cutting in the X-axis direction and cutting in the Y-axis direction can be implemented in any order.

As explained above, the cutting step (S5) produces unsintered compacts that are each an individual piezoelectric element 10 as shown in FIGS. 2A and 2B. In this unsintered compact, the internal electrode films 212, 213 opposingly alternate in the Z-axis direction, with the narrow parts 214 of the internal electrode films 212 and narrow parts 214 of the internal electrode films 213 exposed on the opposite sides in the Y-axis direction.

(S6) Sintering Step

In the sintering step (S6), each unsintered compact obtained in the above step (S5) is sintered. To be specific, the unsintered compact is placed in an alumina sheath and heated to approx. 300° C. to 500° C. to remove binder, followed by sintering at 900° C. to 1050° C. in an atmospheric ambience. As a result, a sintered laminate (ceramic laminate) is obtained.

(S7) External Electrode-Forming Step

In the external electrode-forming step (S7), the external electrodes 14, 15 shown in FIGS. 2A and 2B are formed on the ceramic sintered compact obtained in the above step (S6). As shown in FIGS. 2A and 2B, the external electrode 14 is provided on one side of the ceramic sintered compact and connects all of the internal electrodes 12, while the external electrode 15 is provided on the other side of the ceramic sintered compact and connects all of the internal electrodes 13.

To be specific, a conductive paste containing Ag, etc., is applied to both sides of the ceramic sintered compact in the Y-axis direction, and baked at a temperature of approx. 750° C. to 850° C. This way, external electrodes 14, 15 are formed as Ag electrodes on both sides of the ceramic in the Y-axis direction. The piezoelectric element 10 is now complete.

It should be noted that external electrodes 14, 15 need not be formed on the ceramic sintered compact by means of baking External electrodes 14, 15 may be formed using the sputtering method, vacuum deposition method, or any other thin-film forming method, for example, as long as the formed electrodes can connect the internal electrodes 12, 13, respectively, in a favorable manner.

(S8) Polarization Step

In the polarization step, the piezoelectric ceramic 11 in the piezoelectric element 10 completed in the aforementioned step (S7) is polarized so as to make the piezoelectric element 10 usable as a piezoelectric actuator, etc. Polarization is implemented by applying a high electric field between the external electrodes 14, 15 of the piezoelectric element 10. To be specific, the piezoelectric element 10 is put in silicone oil of 100° C. and an electric field of 3.0 kV/mm is applied for 15 minutes between the external electrodes 14, 15.

(Evaluation of Piezoelectric Element 10)

(1) Evaluation by Electron Probe Micro Analyzer (EPMA)

Figure 6A:
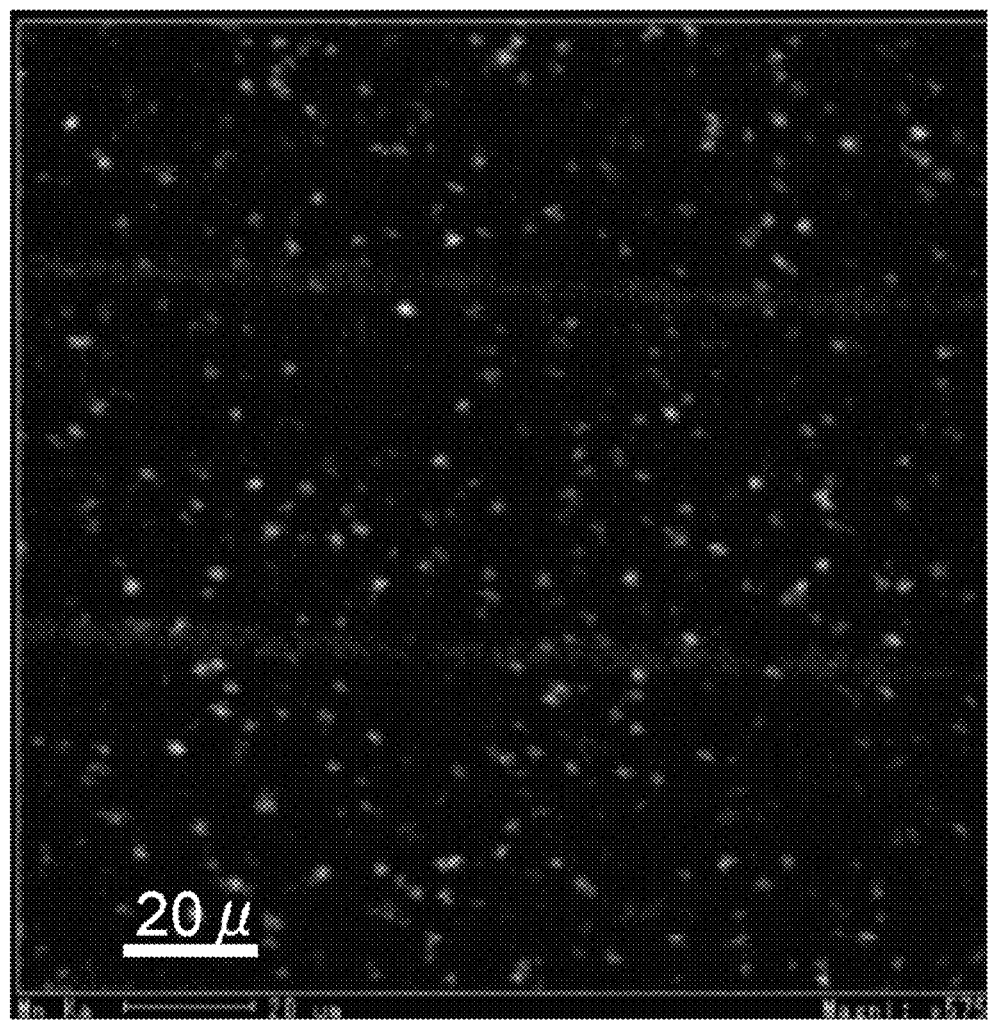
FIG. 6A is an EPMA-observed image of elemental manganese distribution over a cross-section of the piezoelectric element shown in FIG. 2A.
Figure 6B:
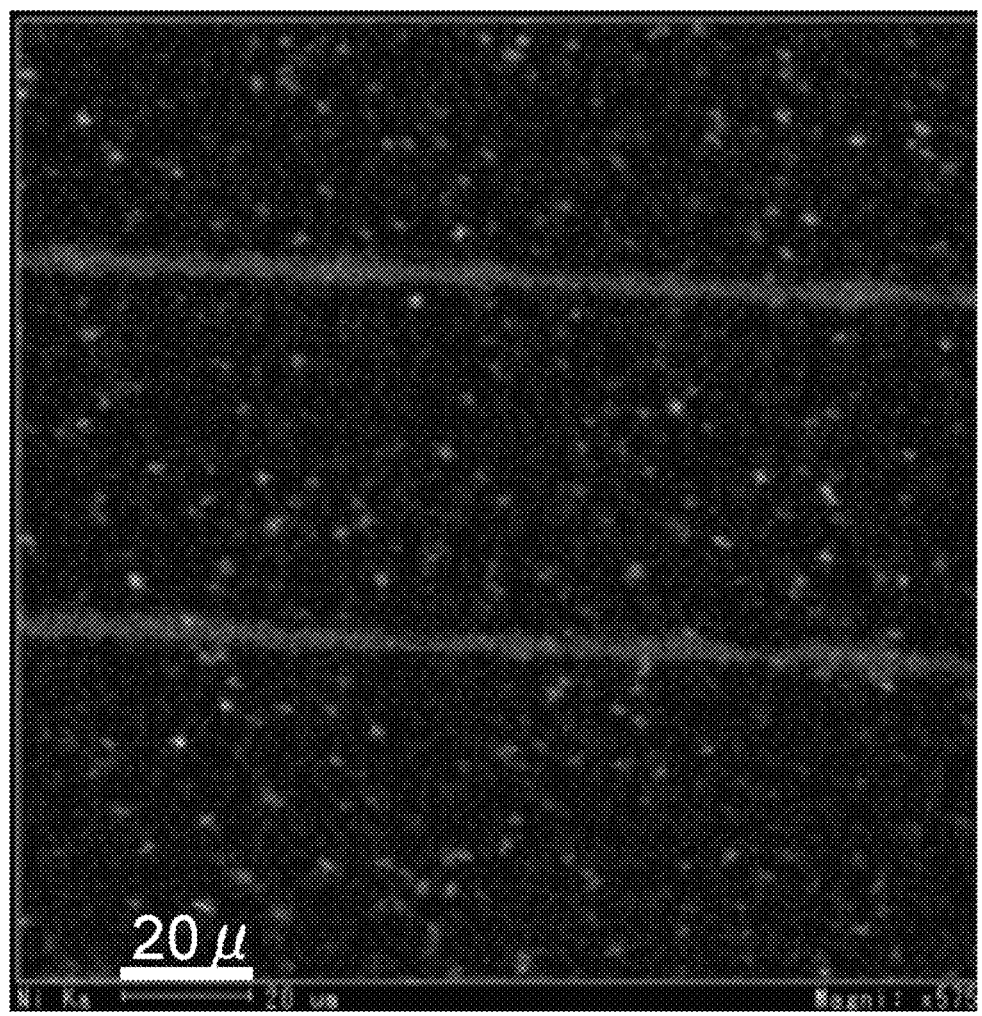
FIG. 6B is an EPMA-observed image of elemental nickel distribution over a cross-section of the piezoelectric element shown in FIG. 2A.

FIGS. 6A and 6B show the results of analysis, using an EPMA (electron probe micro analyzer), of a cross-section of the piezoelectric element 10 pertaining to this embodiment. FIG. 6A shows analysis results of the Kα ray of manganese, while FIG. 6B shows analysis results of the Kα ray of nickel. Positions where elemental manganese is present are indicated by high brightness in FIG. 6A, while positions where elemental nickel is present are indicated by high brightness in FIG. 6B. Both FIG. 6A and FIG. 6B show the same location of the same sample.

With the piezoelectric element 10 pertaining to this embodiment, elemental manganese and elemental nickel are uniformly dispersed in the piezoelectric ceramic 11, as shown by FIGS. 6A and 6B. In addition, comparison of FIGS. 6A and 6B finds that elemental manganese and elemental nickel are present roughly at the same positions. This is probably because elemental manganese and elemental nickel have become one grain, or are present in close proximity to each other, as a result of interaction in the sintering step (S6).

Furthermore, detailed analysis by EDS (energy dispersive X-ray spectrometry) using a TEM (transmission electron microscope) or by other evaluation confirms a tendency of elemental manganese and elemental nickel separating at the grain boundary (including the grain boundary triple point) of the main phase as a crystal whose mother phase is Mn—Ni—O being a solid solution of manganese oxide and nickel oxide. In other words, the crystal grains constituting the main phase contain little elemental manganese or elemental nickel.

This means that, with the piezoelectric element 10 pertaining to this embodiment, elemental manganese and elemental nickel are uniformly dispersed throughout the boundary of crystal grains constituting the main phase throughout the piezoelectric ceramic 11 as a result of simultaneous addition of MnO powder and NiO powder.

In this embodiment, the MnO powder and NiO powder are mixed after calcining the mixed powder constituted by the material powders for the main phase in the aforementioned step (S1). Accordingly, the MnO powder and NiO powder are present as grains independent from the calcined powder of the main phase in steps before this step (S6). In this embodiment, implementing sintering in this condition prevents elemental manganese from clumping together as the main phase is sintered, and consequently provides piezoelectric ceramic 11 having a structure where elemental manganese is densely and uniformly dispersed in the main phase.

A comparative example where the calcined powder of the main phase pertaining to this embodiment and MnO powder are mixed is explained. In this comparative example, a piezoelectric element was produced under the same conditions as in this embodiment, except that only the MnO powder was mixed into the calcined powder and NiO powder was not mixed in.

Figure 7:
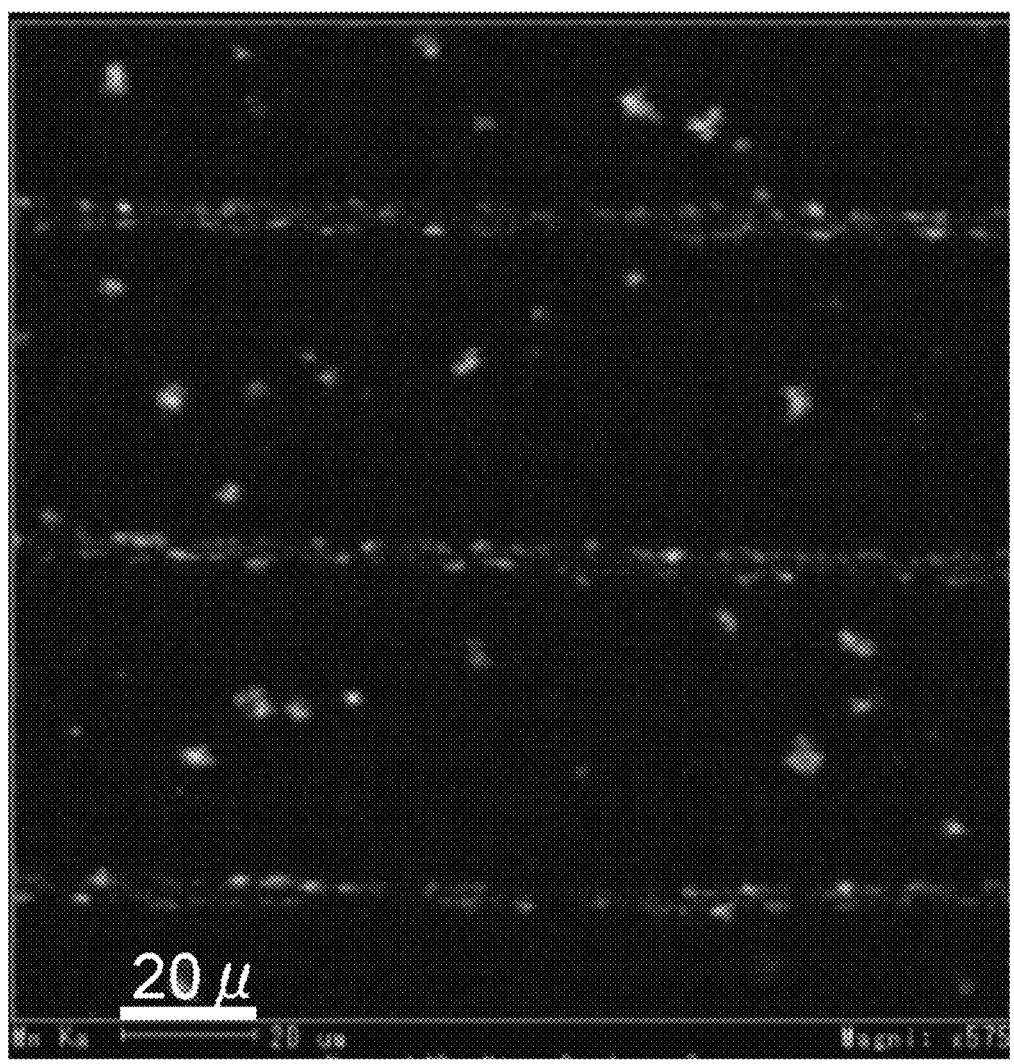
FIG. 7 is an EPMA-observed image of elemental manganese distribution over a cross-section of a piezoelectric element pertaining to a comparative example.

FIG. 7 shows EPMA analysis results of the Kα ray of manganese in a cross-section of the piezoelectric element pertaining to the above comparative example. As shown, elemental manganese constitutes relatively large grains, indicating that elemental manganese is clumped together. This is probably because grains containing elemental manganese came together as a result of interaction when the main phase was sintered in the sintering step (S6). A suspected mechanism at play is that, in the sintering step (S6), the phase containing elemental manganese remains partially at the grain boundary of the main phase due to liquefaction or being discharged from the main phase.

Comparison of the piezoelectric element 10 pertaining to this embodiment and the piezoelectric element pertaining to the comparative example finds that elemental manganese was prevented from clumping together due to the action of elemental nickel, by adding MnO and NiO simultaneously.

(Reliability Evaluation)

(1) Measurement of Specific Resistance ρ

A high DC electric field of 2 kV/mm was applied at 150° C. between the external electrodes 14, 15 of the piezoelectric element 10 pertaining to this embodiment and specific resistance was evaluated under the application of this high electric field. To be specific, the electric field was applied between the external electrodes 14, 15 of the piezoelectric element 10 for 5 minutes, after which current was measured between the external electrodes 14, 15 to calculate the specific resistance ρ (Ω·cm) using this current, unit electric field (2 kV/mm), and crossing area of the internal electrodes 12, 13. Common logarithm (log(ρ)) was used as the indicator in this evaluation. As a result, the value of log (ρ) was 10.0 or greater, which indicates sufficient insulation performance, under any condition pertaining to this embodiment.

(2) Measurement of Piezoelectric Constant $d_{33}{}^*$

The piezoelectric constant $d_{33}{}^*$ of the piezoelectric element 10 was measured at room temperature (25° C.) using a laser Doppler displacement gauge. Electric field strength of 8 kV/mm was applied when displacement was measured. As a result, a high piezoelectric constant $d_{33}{}^*$ of 150 (pm/V) or greater was obtained under any condition pertaining to this embodiment.

(3) Durability Testing

As a durability test of the piezoelectric element 10, the piezoelectric constant $d_{33}{}^*$ was measured before and after the application of high electric field load to evaluate the rate of decrease in piezoelectric constant $d_{33}{}^*$ after the application of high electric field load. To be specific, the rate of decrease in piezoelectric constant $d_{33}{}^*$ was evaluated after an application of load, which is holding the piezoelectric element 10 for 10 hours with a high electric field of 8 kV/mm applied to it at 100° C. In other words, the rate of decrease, as the term is used here, is indicated by the mathematical formula (a) below:

$$\text{(Rate of decrease)} = 100 \times [(\text{Piezoelectric constant } d_{33}{}^*\text{before application of load}) - (\text{Piezoelectric constant } d_{33}{}^*\text{after application of load})]/(\text{Piezoelectric constant } d_{33}{}^* \text{ before application of load})(\%) \quad (a)$$

As a result, the rate of decrease in piezoelectric constant $d_{33}{}^*$ was roughly within 20% under any condition pertaining to this embodiment.

EXAMPLES (1) Addition of MnO and NiO

As Example 1 of this embodiment, piezoelectric element samples 1 to 6 were produced based on the piezoelectric ceramic of Composition Formula (2) below. Here, p and q indicate mol numbers, respectively:

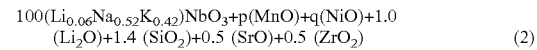

$100(Li_{0.06}Na_{0.52}K_{0.42})NbO_3+p(MnO)+q(NiO)+1.0$
$(Li_2O)+1.4\ (SiO_2)+0.5\ (SrO)+0.5\ (ZrO_2)$ \hfill (2)

Sample 1: p=0.5, q=0.1
Sample 2: p=0.5, q=0.5
Sample 3: p=0.5, q=1.0
Sample 4: p=0.5, q=2.0
Sample 5: p=0.1, q=0.5
Sample 6: p=2.0, q=0.5

Samples 1 to 6 were measured for specific resistance log(ρ) and piezoelectric constant d33* according to the aforementioned procedures. The measured results are as follows:

Sample 1: log(ρ)=10.4, $d_{33*}$=240(pm/V)
Sample 2: log(ρ)=11.1, $d_{33*}$=190(pm/V)
Sample 3: log(ρ)=10.8, $d_{33*}$=170(pm/V)
Sample 4: log(ρ)=10.3, $d_{33*}$=155(pm/V)
Sample 5: log(ρ)=10.5, $d_{33*}$=225(pm/V)
Sample 6: log(ρ)=11.0, $d_{33*}$=165 (pm/V)

The above results show that all samples had good insulation performance and piezoelectric characteristics, evident from their specific resistance log(ρ) of 10.0 or greater and piezoelectric constant $d_{33}{}^*$ of 150 (pm/V) or greater.

Durability testing was conducted on samples 1 to 6 according to the aforementioned procedures. Fifty pieces of each sample were produced and those samples whose rate of decrease in piezoelectric constant $d_{33}^*$ after the durability test was within 20% were counted. The measured results are as follows:

Sample 1: 32/50 pieces
Sample 2: 50/50 pieces
Sample 3: 50/50 pieces
Sample 4: 44/50 pieces
Sample 5: 36/50 pieces
Sample 6: 45/50 pieces The above results show that all samples had good durability under application of high electric field, evidenced by the fact that at least 60% of sample pieces had a rate of decrease in piezoelectric constant $d_{33}^*$ of within 20%.

Next, piezoelectric elements pertaining to Comparative Example 1 of this embodiment were produced. Piezoelectric element samples 7 to 10 were produced in such a way that p and q in Composition Formula (2) representing the piezoelectric ceramics pertaining to this comparative example became as follows:

Sample 7: p=0.5, q=0
Sample 8: p=0.5, q=4.0
Sample 9: p=0, q=0.5
Sample 10: p=4, q=0.5

Samples 7 to 10 were measured for specific resistance $\log(\rho)$ and piezoelectric constant $d_{33}^*$ according to the aforementioned procedures. The measured results are as follows:

Sample 7: $\log(\rho)$=10.2, $d_{33}^*$=250 (pm/V)
Sample 8: $\log(\rho)$=9.6, $d_{33}^*$=120 (pm/V)
Sample 9: $\log(\rho)$=10.1, $d_{33}^*$=230 (pm/V)
Sample 10: $\log(\rho)$=9.8, $d_{33}^*$=130 (pm/V)

These results show that, although all samples maintained a specific resistance $\log(\rho)$ of around 10, sample 8 whose p was 4.0 and sample 10 whose q was 4.0 had a low piezoelectric constant $d_{33}^*$ of less than 150. This indicates that an excessive content of MnO or NiO would cause the piezoelectric constant $d_{33}^*$ to drop.

Durability testing was conducted on samples 7 to 10 according to the aforementioned procedures. Fifty pieces of each sample were produced and those samples whose rate of decrease in piezoelectric constant $d_{33}^*$ after the durability test was within 20% were counted. The measured results are as follows:

Sample 7: 28/50 pieces
Sample 8: 0/50 pieces
Sample 9: 24/50 pieces
Sample 10: 0/50 pieces The above results show that less than 60% of all sample pieces had a rate of decrease in piezoelectric constant $d_{33}^*$ of within 20%. Particularly with sample 8 whose p was 4.0 and sample 10 whose q was 4.0, none of the pieces had a rate of decrease in piezoelectric constant $d_{33}^*$ of within 20%. This indicates that compositions that do not contain either MnO or NiO, or compositions that contain excessive MnO or NiO, would demonstrate less durability under application of high electric field compared to piezoelectric elements conforming to this embodiment.

It should be noted that, because the above examines the contents of MnO and NiO in Composition Formula (2), appropriate contents of MnO and NiO vary for compositions different from Composition Formula (2) above. It is known that, for compositions similar to Composition Formula (2) above, appropriate contents of MnO and NiO are also close. However, the aforementioned effects of this embodiment cannot be obtained through compositions that do not contain either MnO or NiO.

Next, as Example 2 of this embodiment, piezoelectric element sample 11 was produced based on the piezoelectric ceramic of Composition Formula (3) below:

$$100\ (Li_{0.06}Na_{0.52}K_{0.42})NbO_3 +0.5\ (MnO)+0.5\ (NiO)+1.0\ (Li_2O)+1.4\ (SiO_2) \quad (3)$$

On the other hand, as Comparative Example 2 of this embodiment, piezoelectric element sample 12 was produced based on the piezoelectric ceramic of Composition Formula (4) below:

$$100\ (Li_{0.06}Na_{0.52}K_{0.42})NbO_3 +0.5\ (MnO)+0\ (NiO)+1.0\ (Li_2O)+1.4\ (SiO_2) \quad (4)$$

In other words, sample 11 pertaining to Example 2 and sample 12 pertaining to Comparative Example 2 have the same constitution, except that one contains NiO in its piezoelectric ceramic while the other does not.

Samples 11 and 12 were measured for specific resistance $\log(\rho)$ and piezoelectric constant $d_{33}^*$ according to the aforementioned procedures. The measured results are as follows:

Sample 11: $\log(\rho)$=10.8, $d_{33}^*$=170 (pm/V)
Sample 12: $\log(\rho)$=10.5, $d_{33}^*$=150 (pm/V)

The above results show that sample 11 pertaining to Example 2 and sample 12 pertaining to Comparative Example 2 had good insulation performance and piezoelectric characteristics, evident from their specific resistance $\log(\rho)$ of 10.0 or greater and piezoelectric constant $d_{33}^*$ of 150 (pm/V) or greater.

Durability testing was conducted on samples 11 and 12 according to the aforementioned procedures. Fifty pieces of each sample were produced and those samples whose rate of decrease in piezoelectric constant $d_{33}^*$ after the durability test was within 20% were counted. The measured results are as follows:

Sample 11: 48/50 pieces
Sample 12: 0/50 pieces

The above results show that, while at least 60% of all pieces of sample 11 pertaining to Example 2 had a rate of decrease in piezoelectric constant $d_{33}^*$ of within 20%, none of the pieces of sample 12 pertaining to Comparative Example 2 had a rate of decrease in piezoelectric constant $d_{33}^*$ of within 20%. This indicates that compositions that do not contain NiO would demonstrate less durability under application of high electric field compared to piezoelectric elements pertaining to Example 2.

(2) Addition of $Li_2O$ and $SiO_2$

As Example 3 of this embodiment, piezoelectric element samples 13 to 15 were produced based on the piezoelectric ceramic of Composition Formula (5) below. Here, α and β indicate mol numbers, respectively:

$$100\ (Li_{0.06}Na_{0.52}K_{0.42})NbO_3 +0.5\ (MnO)+0\ (NiO)+\alpha\ (Li_2O)+\beta(SiO_2)+1.0\ (SrO)+1.0\ (ZrO_2) \quad (5)$$

Sample 13: α=0.1, β=0.2
Sample 14: α=1.5, β=3.0
Sample 15: α=2.0, β=4.0

Next, a piezoelectric element pertaining to Comparative Example 3 of this embodiment was produced. Piezoelectric element sample 16 was produced in such a way that α and β in Composition Formula (5) representing the piezoelectric ceramic pertaining to this comparative example became as follows:

Sample 16: α=0, β=0

Samples 13 to 16 were measured for specific resistance $\log(\rho)$ and piezoelectric constant $d_{33}^*$ according to the aforementioned procedures. The measured results are as follows:

Sample 13: $\log(\rho)$=10.3, $d_{33}{}^*$=180 (pm/V)
Sample 14: $\log(\rho)$=10.8, $d_{33}{}^*$=170 (pm/V)
Sample 15: $\log(\rho)$=10.2, $d_{33}{}^*$=150 (pm/V)
Sample 16: $\log(\rho)$=9.0, $d_{33}{}^*$=125 (pm/V)

The above results show that samples 13 to 15 pertaining to Example 3 had good insulation performance and piezoelectric characteristics, evident from their specific resistance $\log(\rho)$ of 10.0 or greater and piezoelectric constant $d_{33}{}^*$ of 150 (pm/V) or greater. On the other hand, sample 16 pertaining to the comparative example had a lower specific resistance $\log(\rho)$, specifically lower by at least one digit, compared to samples 13 to 15 pertaining to this example, and its piezoelectric constant $d_{33}{}^*$ was the lowest. In other words, sample 16 pertaining to the comparative example did not have good insulation performance or piezoelectric characteristics.

Durability testing was conducted on samples 13 to 16 according to the aforementioned procedures. Fifty pieces of each sample were produced and those samples whose rate of decrease in piezoelectric constant $d_{33}{}^*$ after the durability test was within 20% were counted. The measured results are as follows:

Sample 13: 31/50 pieces
Sample 14: 50/50 pieces
Sample 15: 45/50 pieces
Sample 16: 12/50 pieces The above results show that, while at least 60% of all pieces of samples 13 to 15 pertaining to Example 3 had a rate of decrease in piezoelectric constant $d_{33}{}^*$ of within 20%, only 12 pieces of sample 16 pertaining to Comparative Example 3 had a rate of decrease in piezoelectric constant $d_{33}{}^*$ of within 20%. This indicates that compositions that do not contain $Li_2O$ and $SiO_2$ would demonstrate less durability under application of high electric field compared to piezoelectric elements pertaining to Example 3.

(3) Addition of SrO and $ZrO_2$

As Example 4 of this embodiment, piezoelectric element samples 17 and 18 were produced based on the piezoelectric ceramic of Composition Formula (6) below. Here, m and n indicate mol numbers, respectively:

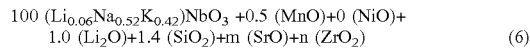
$$100\ (Li_{0.06}Na_{0.52}K_{0.42})NbO_3 + 0.5\ (MnO) + 0\ (NiO) + 1.0\ (Li_2O) + 1.4\ (SiO_2) + m\ (SrO) + n\ (ZrO_2) \quad (6)$$

Sample 17: m =1.0, n =1.0
Sample 18: m =2.0, n =2.0

Next, a piezoelectric element pertaining to Comparative Example 4 of this embodiment was produced. Piezoelectric element sample 19 was produced in such a way that m and n in Composition Formula (6) representing the piezoelectric ceramic pertaining to this comparative example become as follows:

Sample 19: m=4.0, n=4.0

Samples 17 to 19 were measured for specific resistance $\log(\rho)$ and piezoelectric constant $d_{33}{}^*$ according to the aforementioned procedures. The measured results are as follows:

Sample 17: $\log(\rho)$=10.9, $d_{33}{}^*$=185 (pm/V)
Sample 18: $\log(\rho)$=10.2, $d_{33}{}^*$=170 (pm/V)
Sample 19: $\log(\rho)$=10.0, $d_{33}{}^*$=165 (pm/V)

The above results show that all samples had good insulation performance and piezoelectric characteristics, evident from their specific resistance $\log(\rho)$ of 10.0 or greater and piezoelectric constant $d_{33}{}^*$ of 150 (pm/V) or greater.

Durability testing was conducted on samples 17 to 19 according to the aforementioned procedures. Fifty pieces of each sample were produced and those samples whose rate of decrease in piezoelectric constant $d_{33}{}^*$ after the durability test was within 20% were counted. The measured results are as follows:

Sample 17: 50/50 pieces
Sample 18: 46/50 pieces
Sample 19: 24/50 pieces

The above results show that, while at least 60% of all pieces of samples 17 and 18 pertaining to Example 4 had a rate of decrease in piezoelectric constant $d_{33}{}^*$ of within 20%, less than 60% of all pieces of sample 19 pertaining to Comparative Example 4 had a rate of decrease in piezoelectric constant $d_{33}{}^*$ of within 20%. This indicates that compositions that contain excessive SrO and $ZrO_2$ would demonstrate less durability under application of high electric field compared to piezoelectric elements pertaining to Example 4.

It should be noted that, because the above examines the contents of SrO and $ZrO_2$ in Composition Formula (6), appropriate contents of SrO and $ZrO_2$ vary for compositions different from Composition Formula (6) above. It is known that, for compositions similar to Composition Formula (6) above, appropriate contents of SrO and $ZrO_2$ are also close.

Next, piezoelectric elements pertaining to Example 5 of this embodiment were produced. Piezoelectric element samples 20 and 21 were produced in such a way that m and n in Composition Formula (6) representing the piezoelectric ceramics pertaining to this example became as follows:

Sample 20: m=0.5, n=0
Sample 21: m=0, n=0.5

In other words, sample 20 contains SrO but not $ZrO_2$ in its piezoelectric ceramic, while sample 21 contains $ZrO_2$ but not SrO in its piezoelectric ceramic.

Samples 20 and 21 were measured for specific resistance $\log(\rho)$ and piezoelectric constant $d_{33}{}^*$ according to the aforementioned procedures. The measured results are as follows:

Sample 20: $\log(\rho)$=11.4, $d_{33}{}^*$=190 (pm/V)
Sample 21: $\log(\rho)$=10.5, $d_{33}{}^*$=185 (pm/V)

The above results show that samples 20 and 21 pertaining to Example 5 had good insulation performance and piezoelectric characteristics, evident from their specific resistance $\log(\rho)$ of 10.0 or greater and piezoelectric constant $d_{33}{}^*$ of 150 (pm/V) or greater.

Durability testing was conducted on samples 20 and 21 according to the aforementioned procedures. Fifty pieces of each sample were produced and those samples whose rate of decrease in piezoelectric constant $d_{33}{}^*$ after the durability test was within 20% were counted. The measured results are as follows:

Sample 20: 50/50 pieces
Sample 21: 50/50 pieces

The above results show that at least 60% of all pieces of samples 20 and 21 pertaining to Example 5 had a rate of decrease in piezoelectric constant $d_{33}{}^*$ of within 20%. This indicates that compositions that do not contain either SrO or $ZrO_2$ would demonstrate good durability under application of high electric field.

(4) Addition of CaO and $ZrO_2$

Next, as Example 6 of this embodiment, piezoelectric element samples 22 and 23 were produced based on the piezoelectric ceramic of Composition Formula (7) below. Here, m and n indicate mol numbers, respectively:

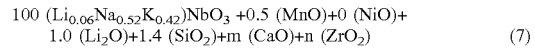
$$100\ (Li_{0.06}Na_{0.52}K_{0.42})NbO_3 + 0.5\ (MnO) + 0\ (NiO) + 1.0\ (Li_2O) + 1.4\ (SiO_2) + m\ (CaO) + n\ (ZrO_2) \quad (7)$$

Sample 22: m =0.5, n =0.5
Sample 23: m =2.0, n =2.0

Samples 22 and 23 were measured for specific resistance log(ρ) and piezoelectric constant $d_{33}^*$ according to the aforementioned procedures. The measured results are as follows:

Sample 22: log(ρ)=11.3, $d_{33}^*$=165 (pm/V)
Sample 23: log(ρ)=10.3, $d_{33}^*$=160 (pm/V)

The above results show that samples 22 and 23 had good insulation performance and piezoelectric characteristics, evident from their specific resistance log(ρ) of 10.0 or greater and piezoelectric constant $d_{33}^*$ of 150 (pm/V) or greater.

Durability testing was conducted on samples 22 and 23 according to the aforementioned procedures. Fifty pieces of each sample were produced and those samples whose rate of decrease in piezoelectric constant $d_{33}^*$ after the durability test was within 20% were counted. The measured results are as follows:

Sample 22: 50/50 pieces
Sample 23: 48/50 pieces

The above results show that at least 60% of all pieces of samples 22 and 23 pertaining to Example 6 had a rate of decrease in piezoelectric constant $d_{33}^*$ of within 20%. This indicates that compositions to which CaO is added instead of SrO would demonstrate good durability under application of high electric field.

(5) Addition of BaO and $ZrO_2$

As Example 7 of this embodiment, piezoelectric element samples 24 and 25 were produced based on the piezoelectric ceramic of Composition Formula (8) below. Here, m and n indicate mol numbers, respectively:

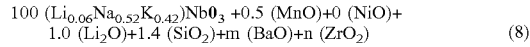

$$100\ (Li_{0.06}Na_{0.52}K_{0.42})NbO_3 + 0.5\ (MnO) + 0\ (NiO) + 1.0\ (Li_2O) + 1.4\ (SiO_2) + m\ (BaO) + n\ (ZrO_2) \quad (8)$$

Sample 24: m=0.5, n=0.5
Sample 25: m=2.0, n=2.0

Samples 24 and 25 were measured for specific resistance log(ρ) and piezoelectric constant $d_{33}^*$ according to the aforementioned procedures. The measured results are as follows:

Sample 24: log(ρ)=10.8, $d_{33}^*$=190 (pm/V)
Sample 25: log(ρ)=10.1, $d_{33}^*$=165 (pm/V)

The above results show that samples 24 and 25 had good insulation performance and piezoelectric characteristics, evident from their specific resistance log(ρ) of 10.0 or greater and piezoelectric constant $d_{33}^*$ of 150 (pm/V) or greater.

Durability testing was conducted on samples 24 and 25 according to the aforementioned procedures. Fifty pieces of each sample were produced and those samples whose rate of decrease in piezoelectric constant $d_{33}^*$ after the durability test was within 20% were counted. The measured results are as follows:

Sample 24: 50/50 pieces
Sample 25: 38/50 pieces

The above results show that at least 60% of all pieces of samples 24 and 25 pertaining to Example 7 had a rate of decrease in piezoelectric constant $d_{33}^*$ of within 20%. This indicates that compositions to which BaO is added instead of SrO would demonstrate good durability under application of high electric field.

(6) Other

As Example 8 of this embodiment, piezoelectric element samples 26 to 31 were produced based on the piezoelectric ceramic of Composition Formula (9) below. Here, (M) indicates at least one of Sr, Ca and Ba:

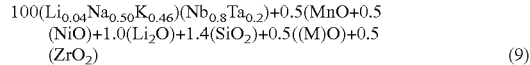

$$100(Li_{0.04}Na_{0.50}K_{0.46})(Nb_{0.8}Ta_{0.2}) + 0.5(MnO + 0.5(NiO) + 1.0(Li_2O) + 1.4(SiO_2) + 0.5((M)O) + 0.5(ZrO_2) \quad (9)$$

Sample 26: (M)=Sr
Sample 27: (M)=Ca
Sample 28: (M)=Ba
Sample 29: (M)=$Ca_{0.5}Sr_{0.5}$
Sample 30: (M)=$Sr_{0.5}Ba_{0.5}$
Sample 31: (M)=$Ca_{0.5}Ba_{0.5}$ Samples 26 to 31 were measured for specific resistance log(ρ) and piezoelectric constant $d_{33}^*$ according to the aforementioned procedures. The measured results are as follows:

Sample 26: log(ρ)=11.5, $d_{33}^*$=205 (pm/V)
Sample 27: log(ρ)=10.0, $d_{33}^*$=190 (pm/V)
Sample 28: log(ρ)=10.7, $d_{33}^*$=210 (pm/V)
Sample 29: log(ρ)=11.0, $d_{33}^*$=200 (pm/V)
Sample 30: log(ρ)=10.8, $d_{33}^*$=205 (pm/V)
Sample 31: log(ρ)=10.6, $d_{33}^*$=210 (pm/V)

The above results show that samples 26 to 31 had good insulation performance and piezoelectric characteristics, evident from their specific resistance log(ρ) of 10.0 or greater and piezoelectric constant $d_{33}^*$ of 150 (pm/V) or greater.

Durability testing was conducted on samples 26 to 31 according to the aforementioned procedures. Fifty pieces of each sample were produced and those samples whose rate of decrease in piezoelectric constant $d_{33}^*$ after the durability test was within 20% were counted. The measured results are as follows:

Sample 26: 50/50 pieces
Sample 27: 50/50 pieces
Sample 28: 50/50 pieces
Sample 29: 50/50 pieces
Sample 30: 50/50 pieces
Sample 31: 50/50 pieces The above results show that at least 60% of all pieces of samples 26 and 31 pertaining to Example 8 had a rate of decrease in piezoelectric constant $d_{33}^*$ of within 20%. This indicates that piezoelectric elements that have the piezoelectric ceramic of the composition pertaining to Example 7 would demonstrate good durability under application of high electric field.

The foregoing explained an embodiment of the present invention, but the present invention is not at all limited to the aforementioned embodiment and various changes may be added to it so long as doing so does not deviate from the main points of the present invention.

The present invention includes, but is not limited to, the following embodiments:

1) A piezoelectric ceramic constituted by a polycrystal whose main phase is an alkali-containing niobate perovskite structure, where both elemental nickel and elemental manganese are present at a grain boundary of the polycrystal.

2) A piezoelectric ceramic according to 1), wherein the main phase is expressed by a composition formula $(Li_x Na_y K_{1-x-y})_a(Nb_{1-z}Ta_z)O_3$ (in the formula, $0.04 < x \leq 0.1$, $0 \leq y \leq 1$, $0 \leq z \leq 0.4$, $0.98 \leq a \leq 1.01$, and $x+y<1$).

3) A piezoelectric ceramic according to 1) or 2), wherein both elemental nickel and elemental manganese are present at a crystal triple point of the polycrystal.

4) A piezoelectric ceramic according to any one of 1) to 3), wherein 0.1 mol or more but 2.0 mol or less of elemental manganese and 0.1 mol or more but 2.0 mol or less of elemental nickel are contained relative to 100 mol of the main phase.

5) A piezoelectric ceramic according to any one of 1) to 4), wherein a crystal containing at least one of elemental nickel and elemental manganese is present at the grain boundary.

6) A piezoelectric ceramic according to 5), wherein an average grain size of the crystal containing at least one of elemental nickel and elemental manganese is in a range of 0.1 μm or more to 5 μm or less.

7) A piezoelectric ceramic according to any one of 1) to 6), wherein an average grain size of the crystal of the main phase is in a range of 0.8 μm or more to 3.0 μm or less.

8) A piezoelectric ceramic according to any one of 1) to 7), wherein 3.0 mol or less of elemental silicon is contained relative to 100 mol of the main phase.

9) A piezoelectric element, comprising: first internal electrodes and second internal electrodes; and piezoelectric ceramic layers which are each constituted by a polycrystal whose main phase is an alkali-containing niobate perovskite structure, positioned between each first internal electrode and second internal electrode, where both elemental nickel and elemental manganese are present at a grain boundary of the polycrystal.

10) A piezoelectric element according to 8), further comprising a first external electrode and second external electrode; wherein the first internal electrodes and second internal electrodes are alternately arranged via the piezoelectric ceramic layers, where the first internal electrodes are each connected to the first external electrode, while the second internal electrodes are each connected to the second external electrode.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, an article "a" or "an" may refer to a species or a genus including multiple species, and "the invention" or "the present invention" may refer to at least one of the embodiments or aspects explicitly, necessarily, or inherently disclosed herein. In this disclosure, any defined meanings do not necessarily exclude ordinary and customary meanings in some embodiments.

The present application claims priority to Japanese Patent Application No. 2012-185100, filed Aug. 24, 2012, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:
1. A piezoelectric ceramic constituted by a polycrystal whose main phase is an alkali-containing niobate perovskite structure, where both elemental nickel and elemental manganese are present as a sub phase at grain boundaries of the main phase,
  wherein the main phase is expressed by a composition formula $(Li_xNa_yK_{1-x-y})_a(Nb_{1-z}Ta_z)O_3$ (in the formula, $0.04<x\leq0.1$, $0\leq y\leq1$, $0\leq z\leq0.4$, $0.98\leq a\leq1.01$, and $x+y<1$),
  wherein 0.2 mol to 3.0 mol of elemental silicon is contained as a silicon-containing sub-phase, besides the main phase, relative to 100 mol of the main phase
  wherein 0.2 mol to 3.0 mol of elemental lithium is contained as a lithium-containing sub-phase, besides the main phase, relative to 100 mol of the main phase, said silicon-containing and lithium-containing sub-phases being dispersed at grain boundaries of the main phase.

2. A piezoelectric ceramic according to claim 1, wherein both elemental nickel and elemental manganese are present at a crystal triple point of the polycrystal.

3. A piezoelectric ceramic according to claim 1, wherein 0.1 mol or more but 2.0 mol or less of elemental manganese and 0.1 mol or more but 2.0 mol or less of elemental nickel are contained relative to 100 mol of the main phase.

4. A piezoelectric ceramic according to claim 1, wherein a crystal containing at least one of elemental nickel and elemental manganese is present at the grain boundary.

5. A piezoelectric ceramic according to claim 4, wherein an average grain size of the crystal containing at least one of elemental nickel and elemental manganese is in a range of 0.1 μm or more to 5 μm or less.

6. A piezoelectric ceramic according to claim 1, wherein an average grain size of the crystal of the main phase is in a range of 0.8 μm or more to 3.0 μm or less.

7. A piezoelectric element according to claim 1, further comprising a first external electrode and second external electrode; wherein first internal electrodes and second internal electrodes are alternately arranged via the piezoelectric ceramic layers, where the first internal electrodes are each connected to the first external electrode, while the second internal electrodes are each connected to the second external electrode.

8. A piezoelectric ceramic according to claim 1, wherein the polycrystal Contains 2.0 mol or less of elemental strontium and 2.0 mol or less of elemental zirconium relative to 100 mol of the main phase.

* * * * *